US012771993B2

(12) United States Patent
Meng et al.

(10) Patent No.: US 12,771,993 B2
(45) **Date of Patent: *Oct. 20, 2026**

(54) BONE CONDUCTION MICROPHONE

(71) Applicant: AAC ACOUSTIC TECHNOLOGIES (SHENZHEN) CO., LTD., Shenzhen (CN)

(72) Inventors: Zhenkui Meng, Shenzhen (CN); Xing Yu, Shenzhen (CN); Ting Kang, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 121 days.

This patent is subject to a terminal disclaimer.

(21) Appl. No.: 18/761,278

(22) Filed: Jul. 1, 2024

(65) Prior Publication Data

US 2025/0274704 A1 Aug. 28, 2025

Related U.S. Application Data

(63) Continuation of application No. PCT/CN2024/078203, filed on Feb. 23, 2024.

(51) Int. Cl.

| | |
|---|---|
| ***H04R 1/46*** | (2006.01) |
| ***B81B 3/00*** | (2006.01) |
| ***H04R 1/04*** | (2006.01) |
| ***H04R 1/08*** | (2006.01) |
| ***H04R 7/06*** | (2006.01) |
| ***H05K 9/00*** | (2006.01) |

(52) U.S. Cl.

CPC ............. *H04R 1/46* (2013.01); *B81B 3/0021* (2013.01); *H04R 1/04* (2013.01); *H04R 1/086* (2013.01); *H04R 7/06* (2013.01); *H05K 9/0049* (2013.01); *B81B 2201/0257* (2013.01); *B81B 2203/0127* (2013.01); *H04R 2201/003* (2013.01)

(58) Field of Classification Search

CPC . H04R 1/46; H04R 1/04; H04R 1/086; H04R 7/06; H04R 2201/003

See application file for complete search history.

(56) References Cited

U.S. PATENT DOCUMENTS

| | | | | |
|---|---|---|---|---|
| 10,999,684 | B1 * | 5/2021 | Wan | H04R 17/02 |
| 2017/0366889 | A1 * | 12/2017 | Schipper | H04R 1/086 |
| 2021/0044890 | A1 * | 2/2021 | Zhang | H04R 1/1083 |
| 2021/0219070 | A1 * | 7/2021 | Zhang | H04R 25/505 |
| 2023/0300536 | A1 * | 9/2023 | Deng | H04R 7/20 381/190 |

* cited by examiner

*Primary Examiner* — Suhan Ni

(74) *Attorney, Agent, or Firm* — Wiersch Law Group

(57) ABSTRACT

A bone conduction microphone is disclosed. The bone conduction microphone includes a circuit board, a housing engaged with the circuit board, a metal cover engaged with the circuit board for forming a first cavity, a vibration assembly, and a MEMS chip disposed in the first cavity. The metal cover includes a top wall and a side wall. The vibration assembly engages with the top wall for forming a second cavity and includes a vibration member and a spacer member. A first conduction cavity is formed by the housing, the vibration assembly, the metal cover and the circuit board. A vibration of the vibration member is transmitted to one side of the MEMS chip through the first conduction cavity, an acoustic channel of the circuit board and a back cavity of the MEMS chip. The bone conduction microphone reduces the electromagnetic interference and improves the SNR.

12 Claims, 3 Drawing Sheets

BONE CONDUCTION MICROPHONE

FIELD OF THE PRESENT DISCLOSURE

The present disclosure relates to acoustoelectric transducers, in particular to a bone conduction microphone.

DESCRIPTION OF THE RELATED ART

Bone conduction microphones convert slight vibrations of bones of the head and neck caused by human voice into electrical signals. Unlike traditional microphones collecting sounds through air conduction, bone conduction microphones can restore sounds with high definition even when used in noisy environments, so as to avoid the noise interference caused by airborne sounds and ensure the sound quality extremely high. However, a bone conduction microphone in the related art has an insufficient SNR (signal to noise ratio), because the electromagnetic interference affects a MEMS (micro electromechanical system) chip and an ASIC (application specific integrated circuit) chip that are used therein.

Thus, it is necessary to provide a novel bone conduction microphone to solve the problems.

SUMMARY

An objective of the present disclosure is to overcome the above problems and provide a bone conduction microphone which can reduce the electromagnetic interference and improve the SNR.

In order to achieve the objective mentioned above, the present disclosure discloses a bone conduction microphone including a circuit board having an acoustic channel, a housing engaged with the circuit board for forming a containing space, a metal cover disposed in the containing space and engaged with the circuit board for forming a first cavity, a vibration assembly disposed in the containing space, a first conduction cavity, and a MEMS chip disposed in the first cavity and fixed to the circuit board. The metal cover includes a top wall spaced apart from the circuit board and a side wall disposed between the top wall and the circuit board. The vibration assembly engages with the top wall for forming a second cavity and includes a vibration member spaced apart from the top wall and a spacer member disposed between the vibration member and the top wall. The first conduction cavity is formed by the housing, the vibration assembly, the metal cover and the circuit board. The MEMS chip has a back cavity, and the acoustic channel communicates the first conduction cavity and the back cavity. A vibration of the vibration member is transmitted to one side of the MEMS chip through the first conduction cavity, the acoustic channel and the back cavity.

As an improvement, the top wall is provided with a communication hole communicating the first cavity and the second cavity. A second conduction cavity is formed by the first cavity, the communication hole and the second cavity. The vibration of the vibration member is also transmitted to another side of the MEMS chip through the second conduction cavity.

As an improvement, the top wall is a metal plate with a porous structure. The porous structure is arranged in an array, and the communication hole is the porous structure.

As an improvement, the top wall is a metal mesh, and the communication hole is a mesh hole of the metal mesh.

As an improvement, the metal cover is formed integrally, or the metal cover is formed by combining the top wall and the side wall.

As an improvement, the vibration member includes a vibration membrane fixed to the spacer member and a mass block fixed to the vibration membrane.

As an improvement, the bone conduction microphone further includes an ASIC chip electrically connected to the MEMS chip. The ASIC chip is arranged in the first cavity and fixed to the circuit board.

As an improvement, the housing is made of metal.

As an improvement, the spacer member is a part of the top wall, and a protrusion of the top wall extending in a direction away from the circuit board forms the spacer member.

As an improvement, the spacer member is a part of the vibration membrane, and a protrusion of the vibration membrane extending in a direction close to the circuit board forms the spacer member.

As an improvement, the vibration membrane is an air-permeable membrane.

As an improvement, the MEMS chip includes a vibration diaphragm, and the vibration diaphragm is an air-permeable diaphragm.

In the bone conduction microphone according to the present disclosure, the metal cover has the function of electromagnetic shielding, so as to reduce the electromagnetic interference affecting the MEMS chip and the ASIC chip, and improve the SNR of the bone conduction microphone. In addition, the top wall of the metal cover can protect the MEMS chip and the ASIC chip from the impact of the vibration member, thereby improving the reliability of the bone conduction microphone.

BRIEF DESCRIPTION OF THE DRAWINGS

In order to more clearly illustrate the technical solutions in embodiments of the present disclosure, the accompanying drawings used in the description of the embodiments will be briefly introduced below. It is apparent that, the accompanying drawings in the following description are only some embodiments of the present disclosure, and other drawings can be obtained by those of ordinary skill in the art based on the accompanying drawings without creative efforts, wherein.

DETAILED DESCRIPTION OF THE EMBODIMENTS

The technical solutions in embodiments of the present disclosure will be described clearly and completely below with reference to the accompanying drawings in the embodiments of the present disclosure. It is apparent that, the described embodiments are merely some of rather than all of the embodiments of the present disclosure. All other embodiments acquired by those of ordinary skill in the art without creative efforts based on the embodiments of the present disclosure shall fall within the protection scope of the present disclosure.

Figure 1:
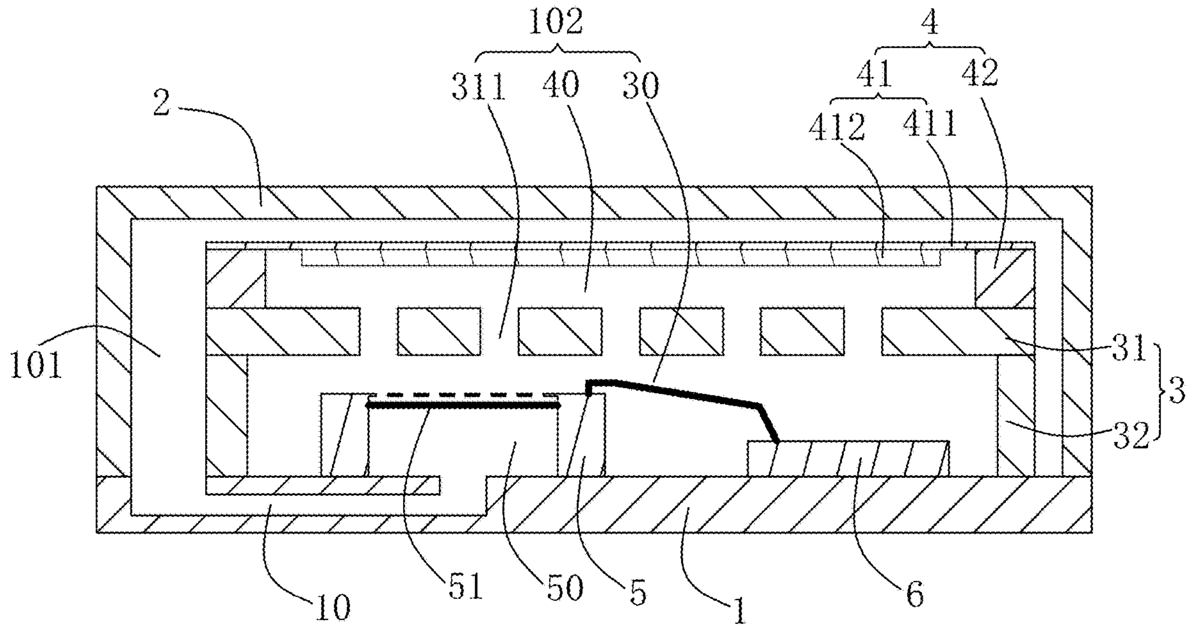
FIG. 1 is a structural schematic diagram of a bone conduction microphone in accordance with an exemplary embodiment of the present disclosure.

Referring to FIG. 1, the present disclosure discloses a bone conduction microphone 100. The bone conduction microphone 100 includes a circuit board 1 having an acoustic channel 10, a housing 2 engaged with the circuit board 1 for forming a containing space, a metal cover 3 disposed in the containing space and engaged with the circuit board 1 for forming a first cavity 30, a vibration assembly 4 disposed in the containing space, and a MEMS chip 5 with a back cavity 50 disposed in the first cavity 30 and fixed to the circuit board 1.

The metal cover 3 includes a top wall 31 spaced apart from the circuit board 1 and a side wall 32 disposed between the top wall 31 and the circuit board 1.

The vibration assembly 4 includes a vibration member 41 spaced apart from the top wall 31 and a spacer member 42 disposed between the vibration member 41 and the top wall 31. The vibration assembly 4 engages with the top wall 31 for forming a second cavity 40.

A first conduction cavity 101 is formed by the housing 2, the vibration assembly 4, the metal cover 3 and the circuit board 1. The acoustic channel 10 communicates the first conduction cavity 101 and the back cavity 50. A vibration of the vibration member 41 is transmitted to one side of the MEMS chip 5 through the first conduction cavity 101, the acoustic channel 10 and the back cavity 50.

Figure 3:
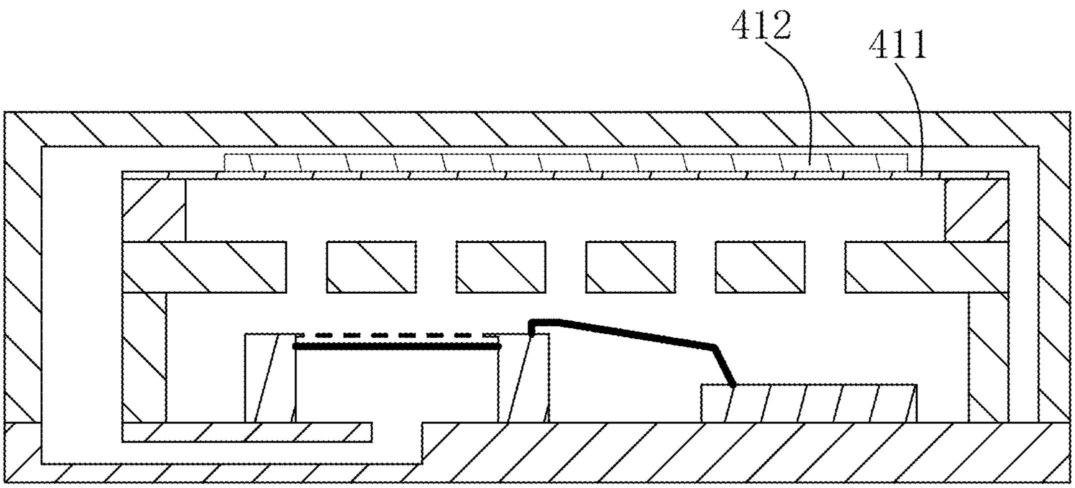
FIG. 3 is a structural schematic diagram of another bone conduction microphone of the present disclosure.

The vibration member 41 includes a vibration membrane 411 fixed to the spacer member 42 and a mass block 412 fixed to the vibration membrane 411. In this embodiment, the mass block 412 is fixed to a lower side of the vibration membrane 411. In another embodiment as shown in FIG. 3, the mass block 412 can be fixed to an upper side of the vibration membrane 411. Optionally, the vibration membrane 411 can be an air-permeable membrane, the air-permeable membrane can be made of air-permeable material, or the air-permeable membrane has an air-permeable structure including but not limited to the hole, gap, notch and movable valve.

The bone conduction microphone 100 further includes an ASIC chip 6 electrically connected to the MEMS chip 5. The ASIC chip 6 is arranged in the first cavity 30 and fixed to the circuit board 1. In other embodiments, the ASIC chip 6 can be fixed to the metal cover 3, or integrated with the MEMS chip 5.

The metal cover 3 has the function of electromagnetic shielding, so as to reduce the electromagnetic interference affecting the MEMS chip 5 and the ASIC chip 6, and improve the SNR of the bone conduction microphone 100. In addition, the top wall 31 of the metal cover 3 can protect the MEMS chip 5 and the ASIC chip 6 from the impact of the vibration member 41, thereby improving the reliability of the bone conduction microphone 100.

Optionally, the housing 2 is made of metal, so as to further improve the effect of electromagnetic shielding and the overall structural strength of the bone conduction microphone 100.

Optionally, the metal cover 3 can be formed integrally, or the metal cover 3 is formed by combining the top wall 31 and the side wall 32. The top wall 31 and the side wall 32 are welded or glued together.

Figure 2:
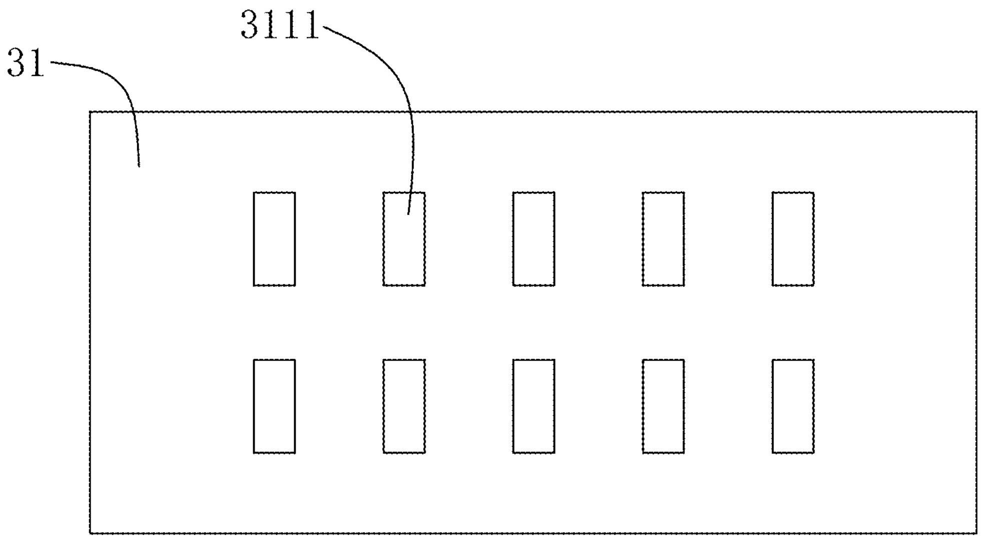
FIG. 2 is a structural schematic diagram of a top wall of a metal cover of the bone conduction microphone in FIG. 1.

Optionally, the top wall 31 can be a wall without any hole, or, the top wall 31 is provided with a communication hole 311 communicating the first cavity 30 and the second cavity 40, in this embodiment, a second conduction cavity 102 is formed by the first cavity 30, the communication hole 311 and the second cavity 40. The vibration of the vibration member 41 is also transmitted to another side of the MEMS chip 5 through the second conduction cavity 102, thereby improving the sensitivity of the bone conduction microphone 100 by differential means. In the embodiment as shown in FIG. 2, the top wall 31 is a metal plate with a porous structure 3111. The porous structure 3111 is arranged in an array, and the communication hole 311 is the porous structure 3111. In other embodiments, the top wall 31 can be a metal mesh, and the communication hole 311 is a mesh hole of the metal mesh. It should be noted that, the communication hole 311 can be a single hole, double holes, or multiple holes more than two, in addition, the number, position, shape, size, formation manner and arrangement manner of the communicating hole 311 are not limited, as long as the communicating hole 311 can communicate the first cavity 30 and the second cavity 40.

Optionally, the MEMS chip 5 includes a vibration diaphragm 51, and the vibration diaphragm 51 can be an air-permeable diaphragm, the air-permeable diaphragm can be made of air-permeable material, or the air-permeable diaphragm has an air-permeable structure including but not limited to the hole, gap, notch and movable valve.

Optionally, the spacer member 42 can be an independent frame structure, or, the spacer member 42 is a part of the top wall 31, and a protrusion of the top wall 31 extending in a direction away from the circuit board 1 forms the spacer member 42, or, the spacer member 42 is a part of the vibration membrane 411, and a protrusion of the vibration membrane 411 extending in a direction close to the circuit board 1 forms the spacer member 42.

The above are only embodiments of the present disclosure. It should be pointed out that those of ordinary skill in the art may also make improvements without departing from the ideas of the present disclosure, all of which fall within the protection scope of the present disclosure.

What is claimed is:

1. A bone conduction microphone, comprising:

a circuit board, having an acoustic channel;

a housing, engaged with the circuit board for forming a containing space;

a metal cover, disposed in the containing space and engaged with the circuit board for forming a first cavity, comprising a top wall spaced apart from the circuit board and a side wall disposed between the top wall and the circuit board;

a vibration assembly, disposed in the containing space and engaged with the top wall for forming a second cavity, comprising a vibration member spaced apart from the top wall and a spacer member disposed between the vibration member and the top wall;

a first conduction cavity, formed by the housing, the vibration assembly, the metal cover and the circuit board; and a MEMS chip, disposed in the first cavity and fixed to the circuit board, having a back cavity, wherein the acoustic channel communicates the first conduction cavity and the back cavity, a vibration of the vibration member is transmitted to one side of the MEMS chip through the first conduction cavity, the acoustic channel and the back cavity.

2. The bone conduction microphone as described in claim 1, wherein the top wall is provided with a communication hole communicating the first cavity and the second cavity, a second conduction cavity is formed by the first cavity, the communication hole and the second cavity, the vibration of the vibration member is also transmitted to another side of the MEMS chip through the second conduction cavity.

3. The bone conduction microphone as described in claim 2, wherein the top wall is a metal plate with a porous structure, the porous structure is arranged in an array, the communication hole is the porous structure.

4. The bone conduction microphone as described in claim 2, wherein the top wall is a metal mesh, the communication hole is a mesh hole of the metal mesh.

5. The bone conduction microphone as described in claim 1, wherein the metal cover is formed integrally, or the metal cover is formed by combining the top wall and the side wall.

6. The bone conduction microphone as described in claim 1, wherein the vibration member comprises a vibration membrane fixed to the spacer member and a mass block fixed to the vibration membrane.

7. The bone conduction microphone as described in claim 6, wherein the spacer member is a part of the vibration membrane, a protrusion of the vibration membrane extending in a direction close to the circuit board forms the spacer member.

8. The bone conduction microphone as described in claim 6, wherein the vibration membrane is an air-permeable membrane.

9. The bone conduction microphone as described in claim 1, further comprising an ASIC chip electrically connected to the MEMS chip, the ASIC chip is arranged in the first cavity and fixed to the circuit board.

10. The bone conduction microphone as described in claim 1, wherein the housing is made of metal.

11. The bone conduction microphone as described in claim 1, wherein the spacer member is a part of the top wall, a protrusion of the top wall extending in a direction away from the circuit board forms the spacer member.

12. The bone conduction microphone as described in claim 1, wherein the MEMS chip comprises a vibration diaphragm, the vibration diaphragm is an air-permeable diaphragm.

* * * * *